United States Patent [19] | [11] 4,186,325
Gudzin | [45] Jan. 29, 1980

[54] CABLE SUPPORTED PIEZOELECTRIC BENDER INTRUSION DETECTOR ARRAY

[75] Inventor: Martin G. Gudzin, Dallas, Tex.

[73] Assignee: Teledyne Industries, Inc., Los Angeles, Calif.

[21] Appl. No.: 935,043

[22] Filed: Aug. 18, 1978

[51] Int. Cl.[2] ........ H01L 41/10

[52] U.S. Cl. ........ 310/331; 310/338; 310/330; 340/568

[58] Field of Search ........ 310/338, 330, 331, 332, 310/340, 337; 340/10, 17 R, 7 R, 565, 566, 665, 666

[56] References Cited

U.S. PATENT DOCUMENTS

| | | | |
|---|---|---|---|
| 3,202,962 | 8/1965 | Elston | 310/337 X |
| 3,230,402 | 1/1966 | Nightingale | 310/338 |
| 3,255,431 | 6/1966 | Howatt | 310/337 X |
| 3,763,464 | 10/1973 | Laurent | 310/338 X |
| 3,805,348 | 4/1974 | Nagata et al. | 310/326 X |
| 4,012,649 | 3/1977 | Cook et al. | 310/331 X |
| 4,097,025 | 6/1978 | Dettmann | 340/566 X |

*Primary Examiner*—Mark O. Budd
*Attorney, Agent, or Firm*—Dowell & Dowell

[57] ABSTRACT

A cable supporting along its length one or more detector units, each comprising a bendable board which is much longer than it is wide and which supports near its center a piezoceramic transducer whose output is responsive to bending of the board, the cable being bared in the vicinity of each transducer and having its conductors connected with the two terminals of the piezoceramic transducer, the board and the portions of the cable immediately adjacent to the board being unitized by a heat shrunk tube which tightly conforms to the board and said cable portions and unifies them so that they become part of the cable with commensurate stiffness.

8 Claims, 7 Drawing Figures 10
12
13
14
15
16
17
19
20
22
24
26
28
29
30
32
34
36
38
40
41
42
43
44
45

CABLE SUPPORTED PIEZOELECTRIC BENDER INTRUSION DETECTOR ARRAY

FIELD OF INVENTION

This invention relates to intrusion detector arrays suitable for burying beneath the surface of the earth to detect intrusions of a type which pressurize the earth surrounding the array, and more particularly relates to an improved type of cable and transducer array where the detectors are built into the cable and located at spaced intervals therealong.

BACKGROUND AND PRIOR ART

The guarding of large areas against intrusion always presents a considerable problem despite the many systems already developed for accomplishing this purpose. Especially in the case of international borders, the expense of installing an effective system is a major consideration because of the great lengths of such borders. Another persistent problem stems from the need to make sensitive detection means which do not at the same time deliver an excessive number of false alarms attributable to spurious stimulations, for instance, caused by induced fields from power lines or storms, by natural seismic activities, by the presence of wild animals, and by the aging and drifting of electrical components forming parts of the system.

U.S. Pat. No. 4,012,649 to Cook & Kerr issued Mar. 15, 1977, and assigned to Teledyne Industries, Inc., Geotech Division, the same assignee as the present application, teaches a buried piezoceramic stress/strain intrusion detector array in which individual detector units are spaced along an interconnecting cable, each of the detector units comprising a small brass box about one and half inches in diameter, and having at least one surface of the box which serves as a diaphragm supporting a piezoceramic transducer which is connected to the conductors of a cable passing through the box, the cable being sealed at entrance ferrules thereto. The cable with the detector units located at spaced intervals therealong is buried along a perimeter, for instance of an international border, and detects pressure from footsteps or from passing vehicle treads. This detector array has, however, the disadvantage of providing a number of false alarm signals, which false signals have been traced to the fact that the brass containers for the individual detector transducers were un-insulated on their outer surfaces, whereby electrical currents flowing through the earth can be conductively coupled into the cable, thereby introducing false readings which are attributable to non-intrusion phenomena rather than to mechanical stressing of the detector transducers within the metal containers. Considerable effort was made to insulate the outsides of the individual detector containers, but no flexible material was found which could be made to accurately conform to the shape of the detector containers while at the same time bonding to the cable jackets on either side thereof so as to achieve the necessary mechanical and insulating properties simultaneously. It was therefore necessary to develop a new detector construction which would provide about the same sensitivity to stressing of the soil in which the unit is buried, while at the same time providing complete detection insulation of the units from currents flowing through the earth.

THE INVENTION

The present invention teaches an array wherein the individual detector units are combined with an interconnecting cable having an insulating outer jacket of predetermined diameter, by mounting the piezoceramic transducers on elongated bendable boards which are not much wider than the cable, and are very much longer than they are wide. The cable is laid over the surface of the board and has its inner conductor connected with the piezoceramic transducer by a tab designed to isolate the transducer from strains attributable to tensioning or flexing of the cable. The outer conductor of the cable is strongly anchored to a conductive surface of the board so that the cable will not easily be pulled out of the detector unit. A heat shrinkable insulating tubing having a meltable inner coating is pulled over the detector unit board and over the end portions of the cable located adjacent to the board and is heat shrunk so that it tightly conforms to the board and to the cable end portions, while at the same time the inner coating of the tubing melts and is bonded to the cable jacket thereby structurally unifying the board and the cable end portions adjacent thereto to provide them with a stiffness against flexing which is at least as great as the stiffness of the cable beyond the tubing. In one embodiment of the invention a specially constructed cable is used whose inner insulating materials are not softened by the heat shrinking process which conforms the tubing to the cable, and which has a special drain wire located in the vicinity of the shield of the cable which takes the mechanical strain off of the outer shield thereby strengthening the cable against damage to the cable itself by excessive tension forces.

It is a principle object of the invention to provide an intrusion detector array comprising a cable having detector units mounted along the cable and sealed therewith such that the detector units cannot conductively pick up electrical currents from the soil in which the array is buried.

It is another important object of the invention to provide a cable and detector unit array in which the detector units are shaped so that they are very much longer than they are wide, and their widths are selected such that they can be fitted into shrinkable insulating tubing prior to shrinking of the tubing, and such that after such shrinking the tubing will tightly conform both to the transducer units and to the cable portions entering and departing therefrom. In the embodiment currently being manufactured, the outer diameter of the cable is about 3/16 inch, the detector boards are about ⅜ inch wide and about ⅛ inch thick, and the boards are about 4" long, their longitudinal ends being tapered to approach the diameter of the cable.

It is another important object of the invention to provide an interconnecting cable and detector unit structure wherein the detector units are sealed to the cable using moisture impervious heat shrinkable tubing having an inner coating which melts at the heat-shrink temperature and which bonds to the outer jacket of the cable to form a moisture-excluding seal of the detector units to the cable.

It is a further object of the invention to provide a cable mounted detector array having high sensitivity to bending of the board in the vicinity of the piezoceramic transducer, whereby reasonable spacing between detector units on the cable may be had without dead spots occurring in the monitored area. The present detector units are mounted at 18 inch spacings on the cable and are buried to about 18 inches depth in a continuous trench. The trench is dug to a depth of about 2 feet and is filled with 6 inches of sand on which the detector cable is laid, and then another 6 inches of sand is packed over the cable in the trench. This gives a substantially homogeneous medium in which the cable is buried, thereby excluding rocks or other larger particles which might bridge the transducer unit or damage the cable when the medium is packed down. Finally, the upper foot of the trench is filled with soil which is then levelled so as to conceal the fact that a cable has been buried at that location. The substantially homogeneous nature of the sand tends to mitigate the fact that orientation of the transducer supporting board makes some difference in the sensitivity of the detector, the board preferably lying essentially horizontal.

Still another object of the invention is to provide a structure in which the cable is strongly secured to the detector board and in which the cable itself is specially built to withstand tension forces applied thereto, which sometimes occur during handling and burying of the array.

Other objects and advantages of the invention will become apparent during the following discussion of the drawings:

THE DRAWINGS

Figures 1, 2, 3, 4, 5, 6, 7:
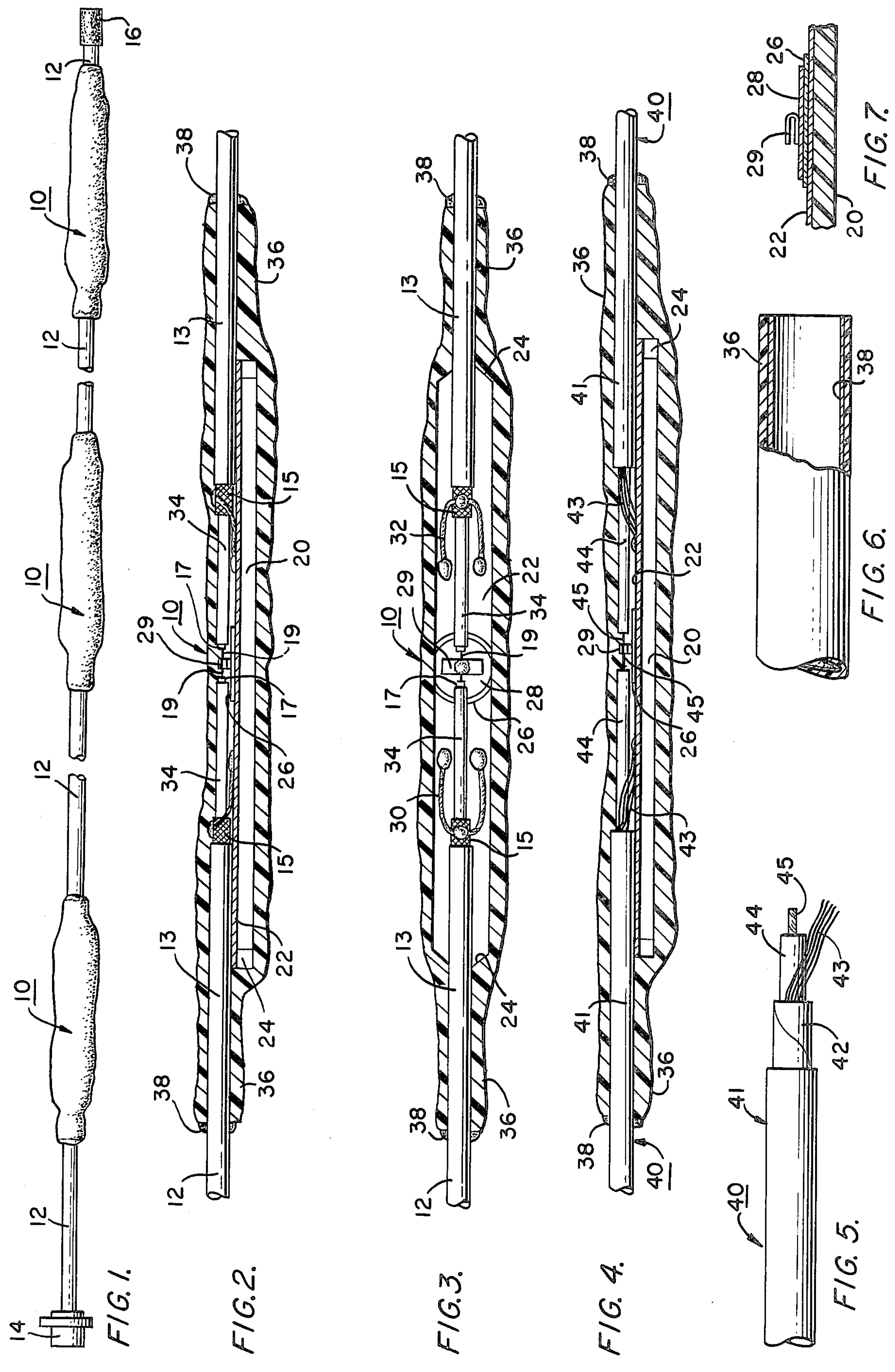
FIG. 1 is a plan view of an array according to the present invention comprising multiple discrete detector units mounted on a cable and spaced along the length thereof, the cable having a connector for connection with electronic detection circuitry (not shown)
FIG. 2 is an enlarged elevation view partly in cross-section taken through one of the detector units and showing the interior thereof.
FIG. 3 is an enlarged plan view partly in cross-section taken through one of the detector units shown in FIG. 1 and showing the interior thereof.
FIG. 4 is a view similar to FIG. 2, but showing a modified form of the detector unit.
FIG. 5 is an elevational view of one end of a modified form of the cable using a foil shield and a drain wire, rather than braid.
FIG. 6 is a view partly in cross-section showing a length of heat shrink tubing having a meltable coating on the interior thereof.
FIG. 7 is an enlarged fragmentary view taken through the metal clad board, the piezoceramic transducer disc and the electrode in the interior of a detector unit according to the embodiments of the invention shown in FIGS. 2, 3 and 4.

Referring now to the drawing, FIG. 1 shows an array of discrete detector units 10 mounted on an interconnecting cable 12 which carries at one end a cable connector 14 suitable for plugging the array into electronic amplifier circuitry (not shown) forming a part of an intrusion alarm system. The other end of the cable 12 could carry a complementary cable connector if desired, but as manufactured, it is usually terminated by a heat shrink cap 16 with a meltable interior which bonds to the cable jacket to exclude moisture. When two cables are joined it is done by water-proof splicing.

FIGS. 2 and 3 show an embodiment of the detector unit carried by an ordinary coaxial cable 12. The cable 12 as seen in FIGS. 2 and 3 has an outer jacket 13 covering a braid shield 15 from which there extends polystyrene insulation 17 covering a center conductor 19. The detector itself as can be seen in FIGS. 2, 3, and 7 is supported on an homogeneous epoxy-glass board which is about an $\frac{1}{8}$ inch thick, $\frac{3}{8}$ inch wide and 4 inches long. The board 20 which is actually used in manufacturing the present products is manufactured by the Oak Materials Group, Inc., of Atlantic Laminates, Franklin, N.H. The particular board used is their type AL 910 Board. This board has better machining characteristics than their type G 10, which is so difficult to cut and machine that it dulls manufacturing tools too quickly for practical use. The board is metal clad with a thin copper surface 22 bonded thereto in a manner well known in the art. It also has satisfactory flexure characteristics, while at the same time having quite adequate strength for the present purpose. The board 20 is preferably tapered somewhat as shown at 24 in the vicinity of its ends so as to make it easier to draw the heat shrink tubing 36 over it during manufacture as will be discussed hereinafter.

The transducer itself is made in a manner well known per se, and comprises a piezoceramic disc 26 which is bonded with an epoxy that becomes conductive when cured under pressure to the metal clad surface 22 of the board 20. The disc 26 has an electrode 28 similarly bonded to its exposed opposite surface and the electrode 28 has a conductive flexible tab 29 fastened to it with the aforementioned conductive epoxy. The tab 29 being soldered to the center conductor wire 19 of the cable as can be seen in FIGS. 2, 3, and 4.

The braid shield 15 of the coaxial cable 12 is conductively connected to the conductive surface 22 of the supporting board 20 by two U-shaped wire yokes 30 and 32. The centers of the yokes are soldered directly to the braid, whereas, the free ends of the yokes are soldered on each side of the cable to the metal surface 22, whereby to anchor the coaxial cable 12 to the board and make it more difficult to pull the cable out of the detector unit 10.

A short length of sleeving 34 is pulled over the polystyrene inner insulating material 17 to protect the center conductor, as the polystyrene may soften or melt both during the soldering of the U-shaped yokes 30 and 32 to the braid 15, and during the shrinking of the heat shrink tubing 36 onto the detector unit and onto the cable jackets at the end portions of the cable which are immediately adjacent to the detector unit.

A suitable heat shrink tubing 36 is illustrated in FIG. 6, this tubing being heat shrinkable onto the detector units and the adjacent cable portions and the tubing having an inner meltable coating 38 which melts at the heat shrink temperature and bonds to the jacket 13 of the cable. It will be seen by looking at FIGS. 2, 3, and 4 that when the tubing 36 is heated to shrink it into close conformity with the board 20 and the cable 12, some of the meltable coating 38 is squeezed out from inside the tubing 36, this meltable material bonding to the jacket 13 of the cable. This provides an excellent seal against moisture and completes the outer insulation of the array, thereby preventing electrical leakage through these joints between the tubing 36 and the outer jacket 13 of the cable. This tubing is manufactured by the Alpha Wire Corporation of Elizabeth, N.J. and is their type FIT-300. Three-eighths inch diameter tubing fits well over the board 20 with the parts attached thereto and is able to heat shrink very tightly onto the jacket 13 of the cable 12.

The board 20 is made as wide as possible to still fit within the $\frac{3}{8}$ inch diameter tubing 36. The board is much longer than its width and has the piezoceramic transducer mounted at its center with the longitudinal ends of the board extending outwardly therebeyond and along a considerable length of cable to which it is effectively attached by the heat shrink tubing 36. This tubing 36 is rather stiff when shrunk onto the cable and detector unit and unifies them in such a manner that the stiffness of the detector unit as well as the portions of the cable 12 entering thereinto is actually greater than the stiffness of the cable itself between detector units.

Turning now to the modified embodiment shown in FIGS. 4 and 5, this embodiment is similar to the embodiment of FIGS. 2 and 3 except that a somewhat different type of cable is used in order to achieve certain advantages which are about to be explained. Similar parts in the various modifications are provided with similar reference numerals. The board 20, the transducer 26, 28 and 29, the tubing 36 and its coating 38 are the same as in the other embodiment. However, the coaxial cable 12 has been replaced by a different type of cable as will now be explained. The modification shown in FIGS. 4 and 5 employs a cable 40 having an outer jacket 41 which is the same as the jacket 13, but the interior of the cable is different. The braid 15 in the cable 12 has been replaced in the cable 40 by a wound foil shield 42 which extends the length of the cable. Beneath the shield 42 is a multiple-strand drain wire 43 which serves as a strengthening means for the cable as well as a means to ground the shield 42 to the circuit board conductive surface 22. The stranded drain wire 43 has its strands oriented side-by-side and wound helically about the interior insulator, the strands thereby being readily concealed beneath the foil shield 42 and substantially making no lump thereunder. The interior insulation 44 is made of polypropylene instead of polystyrene. The reason for this change is that polypropylene insulation will not melt when the center conductor 45 of the cable 40 is soldered to the tab 29, and in addition, the polypropylene will not melt when the tubing 36 is heat shrunk onto the cable and onto the detector unit. Thus, by this change of insulation it becomes possible to eliminate the two sleeves 34 which had to be used in the embodiment shown in FIGS. 2 and 3 to prevent melting of the polystyrene insulation 17.

The reason for the modification from a braid shield 15 to a foil shield 42 with a drain wire 43 beneath it is to strengthen the cable against damage by excessive tensioning of the cable especially while it is being buried. It is known to manufacturers and users of coaxial cable with braid shielding that when the braid and center conductor are anchored, and the cable is subsequently stretched, the center conductor and the end of the braid which is anchored tend to remain fixed. However, the braid has a great deal of "give" so that it easily stretches beneath the jacket of the cable, thereby placing most of the strain on the center conductor. If the center conductor does not actually break, it is permanently stretched inside the cable. When the cable is subsequently released from tension and shrinks in length again, the center conductor now being too long for the cable tends to penetrate through the inner insulation and short out against the braid. The advantage of the newer type cable shown in FIG. 5 is that the drain wire 43 and the center conductor 45 share the strain between them rather than leaving most of the strain to be withstood by the center conductor. Thus, a much greater tensioning of the cable can be withstood without permanent stretching of either conductor.

In the embodiment of FIG. 4, the foil-shield type of cable is used, and the drain wire is merely laid against the board and soldered thereto. The polypropylene insulation does not melt, and it is not necessary to provide a U-shaped yoke such as the yokes 30 and 32 used in the embodiment of FIGS. 2 and 3. By this means, a much stronger array is obtained since the cable itself is much stronger and also its anchoring to the board using the straight drain wires is also much stronger.

It will be noted in FIG. 3 that the piezoceramic disc 26 and the electrode 28 have been flattened on their side surfaces where they lie along the longitudinal edges of the glass epoxy-board 22. The piezoceramic unit is circular as supplied by the manufacturer, it being more economical to use a standard circular disc than to have a special shape made for the board. However, the disc is too great in diameter to lie within a $\frac{3}{8}$ inch board. Therefore, the disc is first bonded to the board and the board is then abraded along with the disc to the required $\frac{3}{8}$ inch width. Care must be taken to prevent metal particles from shorting out the exposed edge of the ceramic crystal, which after grinding is only 0.010 inch thick. The normal leakage path is 0.050 inch between the edge of the electrode 28 and the metal clad surface 22. A rectangular piezoceramic crystal would fit the board better, but the difference in performance is so slight as to not warrant the expense of having special shaped piezoceramic units manufactured for this application.

The present invention is not to be limited to the precise forms shown in the drawings, for obviously changes can be made within the scope of the following claims.

I claim:

1. A combined detector unit and connecting cable for use in an array of multiple interconnected units to be buried below the surface of the earth and coupled to circuitry to detect intrusions which apply pressures to said surface above the array, comprising:

a cable having an insulating jacket of predetermined outer diameter and having plural conductors within said jacket;

at least one detector unit comprising a flexible board having a conductive surface, the board having a length which is much greater than its transverse width, a piezoceramic transducer wafer having one side conductively bonded to the conductive surface of the board and spaced from the longitudinal ends of the board and the wafer having a metal electrode conductively bonded to its other side;

the cable being disposed longitudinally across the board and extending beyond the board both ways from its transverse ends and having its jacket cut away in the vicinity of the transducer wafer and having one of its conductors connected to said conductive surface and having another conductor connected to said electrode; and heat shrinkable insulating tubing surrounding the board and the portions of the cable immediately adjacent to the board, the tubing being heat shrunk to conform tightly to the board and said cable portions to structurally unify the board and cable portions and provide them with stiffness against flexing at least as great as the stiffness of the cable beyond said adjacent cable portions, and the tubing being sealed to the cable portions to exclude the entry of moisture.

2. A detector and cable array as claimed in claim 1, wherein said cable is a coaxial cable having its jacket cut away in the vicinity of the piezoceramic transducer, the cable having its center conductor connected to said electrode and having its outer conductor connected to the conductive surface of the board on both sides of the transducer.

3. A detector and cable array as claimed in claim 2, wherein the cable has insulation between the center conductor and the outer conductor having a melting temperature higher than the temperature required to heat shrink said tubing.

4. A detector and cable array as claimed in claim 2, wherein the cable has a foil sheath comprising said outer conductor and has a drain wire extending longitudinally of the cable beneath the jacket and in contact with the sheath, and said drain wire being soldered to the conductive surface of the board on both sides of the transducer to withstand tension forces applied to the cable.

5. A detector and cable array as claimed in claim 2, wherein a flexible conductive tab is coupled between said center conductor and said electrode to relieve strain on the transducer when the cable is tensioned and flexed.

6. A detector and cable array as claimed in claim 2, wherein the outer conductor is wire braid, and wherein the center of a U-shaped wire yoke is connected to the braid and the ends of the wire yoke are connected to the conductive surface of the board on both sides of the cable to anchor the braid to the board.

7. A detector and cable array as claimed in claim 1, wherein said tubing comprises an impervious outer skin of heat shrinkable plastic lined with an interior coating which melts at the heat shrink temperature and bonds to the portions of the cable jacket adjacent to the board.

8. A detector and cable array as claimed in claim 1, wherein said board comprises an epoxy-glass insulating board having its ends tapered toward the cable, and the board being metal clad on one side to provide said conductive surface.

* * * * *